United States Patent
Maruyama

(10) Patent No.: US 7,674,401 B2
(45) Date of Patent: Mar. 9, 2010

(54) METHOD OF PRODUCING A THIN CONDUCTIVE METAL FILM

(75) Inventor: Mutsuhiro Maruyama, Fuji (JP)

(73) Assignee: Asahi Kasei Kabushiki Kaisha, Osaka (JP)

(*) Notice: Subject to any disclaimer, the term of this patent is extended or adjusted under 35 U.S.C. 154(b) by 498 days.

(21) Appl. No.: 10/497,602

(22) PCT Filed: Dec. 16, 2002

(86) PCT No.: PCT/JP02/13141

§ 371 (c)(1), (2), (4) Date: Jun. 3, 2004

(87) PCT Pub. No.: WO03/051562

PCT Pub. Date: Jun. 26, 2003

(65) Prior Publication Data

US 2005/0069648 A1 Mar. 31, 2005

(30) Foreign Application Priority Data

Dec. 18, 2001 (JP) ............................. 2001-384573
Apr. 1, 2002 (JP) ............................. 2002-098604

(51) Int. Cl.
*H01B 1/00* (2006.01)

(52) U.S. Cl. .................. 252/500; 252/188.26; 252/600; 118/666; 118/725; 427/123; 427/126.1; 427/126.3; 427/229; 427/453; 427/455; 427/461; 427/485; 428/32.25; 428/416; 428/540; 428/626

(58) Field of Classification Search ............. 427/383.1, 427/123, 126.1, 126.3, 229, 453, 455, 461, 427/485; 424/401; 428/323, 220, 32.25, 428/626, 416, 540; 252/52, 304, 600, 182.28, 252/500, 188.26; 568/861; 106/31.65; 446/474; 525/440; 205/159; 349/113; 216/35, 101; 75/232; 419/22; 430/314; 118/666, 725
See application file for complete search history.

(56) References Cited

U.S. PATENT DOCUMENTS

| | | | | |
|---|---|---|---|---|
| 3,317,321 A * | 5/1967 | Chopoorian ................. 252/600 |
| 3,434,889 A * | 3/1969 | Cox et al. .................... 148/280 |
| 3,544,389 A * | 12/1970 | Vazirani ..................... 428/416 |
| 4,564,424 A * | 1/1986 | Cassat et al. ................ 428/626 |
| 4,725,483 A * | 2/1988 | Ishii et al. .................... 428/220 |
| 4,763,133 A * | 8/1988 | Takemura et al. ........... 343/912 |
| 4,857,266 A * | 8/1989 | Sheinberg et al. ............. 419/22 |
| 4,892,581 A * | 1/1990 | Sheinberg et al. ............. 75/232 |
| 5,006,200 A * | 4/1991 | Chen ........................... 216/35 |
| 5,106,533 A * | 4/1992 | Hendrickson et al. .... 106/31.65 |
| 5,151,204 A * | 9/1992 | Struglinski .................. 508/591 |
| 5,200,456 A * | 4/1993 | Teyssie et al. ............... 524/430 |
| 5,492,595 A * | 2/1996 | Carano et al. ............... 216/101 |
| 5,552,496 A * | 9/1996 | Vogt-Birnbrich et al. .... 525/440 |
| 5,736,065 A * | 4/1998 | Nakaso et al. .......... 252/188.26 |
| 5,865,885 A * | 2/1999 | Kwan ......................... 106/460 |
| 5,897,958 A * | 4/1999 | Yamada et al. .............. 446/474 |
| 5,928,830 A * | 7/1999 | Cheng et al. ........... 430/137.12 |
| 5,939,182 A * | 8/1999 | Huang et al. ................. 428/323 |
| 5,945,217 A * | 8/1999 | Hanrahan .................... 428/389 |
| 6,039,859 A * | 3/2000 | Sonnenberg et al. ........ 205/159 |
| 6,051,614 A | 4/2000 | Hirai et al. |
| 6,084,059 A * | 7/2000 | Matsushita et al. .......... 528/414 |
| 6,200,680 B1* | 3/2001 | Takeda et al. ............... 428/402 |
| 6,203,899 B1* | 3/2001 | Hirose et al. ............. 428/32.25 |
| 6,291,725 B1* | 9/2001 | Chopade et al. ............. 568/861 |
| 6,319,321 B1* | 11/2001 | Hiraga et al. ................ 118/666 |
| 6,366,333 B1 | 4/2002 | Yamamoto et al. |
| 6,416,818 B1* | 7/2002 | Aikens et al. ............. 427/383.1 |
| 6,478,866 B1* | 11/2002 | Nyssen et al. ............... 106/503 |
| 6,555,591 B1* | 4/2003 | Tomosada et al. ........... 521/124 |
| 6,667,360 B1* | 12/2003 | Ng et al. ..................... 524/492 |
| 6,703,186 B1* | 3/2004 | Yanagimoto et al. ........ 430/314 |
| 2002/0045057 A1* | 4/2002 | Guritza ....................... 428/540 |
| 2002/0054894 A1* | 5/2002 | Agostini et al. ............. 424/401 |
| 2003/0051580 A1* | 3/2003 | Lewis et al. ................... 75/362 |

FOREIGN PATENT DOCUMENTS

| | | |
|---|---|---|
| DE | 14074 | 9/1955 |
| EP | 0036940 A1 | 10/1981 |
| EP | 0 264 204 A1 | 4/1988 |
| EP | 0346954 A2 | 12/1989 |
| JP | 61-217581 A | 9/1986 |
| JP | 62-192544 * | 8/1987 |

(Continued)

OTHER PUBLICATIONS

English translation of DE 14074 (Sep. 29, 1955).

(Continued)

*Primary Examiner*—Mark Kopec
*Assistant Examiner*—Khanh Tuan Nguyen
(74) *Attorney, Agent, or Firm*—Birch, Stewart, Kolasch $ Birch, LLP.

(57) ABSTRACT

The present invention relates to a metal oxide dispersion, which can form a metal thin film onto a substrate by heat treatment at a low temperature, wherein a metal oxide having a particle diameter of less than 200 nm is dispersed in the dispersion medium. By heat treating the dispersion after applying it onto a substrate, a metal thin film is formed.

17 Claims, No Drawings

FOREIGN PATENT DOCUMENTS

| | | | |
|---|---|---|---|
| JP | 01-234305 | * | 3/1988 |
| JP | 01047801 A | | 2/1989 |
| JP | 64-083629 | * | 3/1989 |
| JP | 05013275 A | | 1/1993 |
| JP | 5-98195 | | 4/1993 |
| JP | 5-195110 | | 8/1993 |
| JP | 05-274910 | * | 10/1993 |
| JP | 06-115934 | * | 4/1994 |
| JP | 06145681 A | | 5/1994 |
| JP | 11-6004 | | 1/1999 |
| JP | 11-080618 | * | 3/1999 |
| JP | 11-152506 | | 6/1999 |
| JP | 2000-500826 | | 1/2000 |
| JP | 2001-181756 | * | 7/2001 |
| JP | 2001-254185 | * | 9/2001 |
| JP | 2561537 | | 9/2004 |
| WO | WO 00/76699 A1 | | 12/2000 |

OTHER PUBLICATIONS

English translation of European Patent Publication No. 0 036 940, Oct. 7, 1981.

* cited by examiner

METHOD OF PRODUCING A THIN CONDUCTIVE METAL FILM

TECHNICAL FIELD

The present invention relates to a dispersion of a metal oxide which is suitable for forming a metal thin film and a process for forming a metal thin film onto a substrate using this dispersion. The present invention also relates to a process for producing a porous metal thin film.

BACKGROUND ART

Conventionally, methods such as vacuum evaporation, sputtering, CVD, plating and metal paste method have been known as a method for forming a metal thin film onto a substrate. Among these methods, vacuum evaporation, sputtering and CVD all suffer from the problem that they require an expensive vacuum chamber, and that their film deposition rates are slow.

Plating methods can relatively easily form a metal thin film on substrates that are conductive. However, when forming a thin film on an insulating substrate, plating requires first forming a conductive layer, which makes the process cumbersome. Plating methods suffer from another problem in that because they rely on a reaction in solution, a large amount of waste liquid is generated, which takes a lot of effort and cost to clean up.

A metal paste method is a method which involves applying a solution in which metal particles are dispersed onto a substrate, followed by heat treatment to give a metal thin film. This method has the advantages that it does not require special equipment such as that of vacuum evaporation and the like, and the process is simple. However, to fuse the metal particles, the process usually requires a high temperature of 1000° C. or more. Thus, the substrates are restricted to those having heat resistance such as ceramic substrates, and there still remains the problem that the substrate will be susceptible to damage from heat or residual stress caused by the heating.

On the other hand, there is a known technique for lowering the baking temperature of a metal paste by decreasing the particle diameter of the metal particles. For example, JP-B-2561537 discloses a method for forming a metal thin film using a dispersion into which metal fine particles having a particle diameter of 100 nm or less are dispersed. However, because the method for producing the necessary metal particles having a particle diameter of 100 nm or less is a method which involves rapid cooling of metal vapor vaporized under low pressure, this method suffers from the problems that mass production is difficult and that the cost of the metal particles is very high. A method which involves forming a metal thin film using a metal oxide paste which has metal oxide particles dispersed therein is also known. A method is disclosed in JP-A-05-98195 which involves heating a crystalline polymer-containing metal oxide paste into which a metal oxide having a particle diameter of 300 nm or less is dispersed, whereby the crystalline polymer is decomposed to obtain a metal thin film. However, this method requires previously dispersing the 300 nm or less metal oxide into the crystalline polymer, which in addition to requiring a lot of effort, also requires a temperature of 400 to 900° C. to decompose the crystalline polymer. Thus, this method has the problem that usable substrates require heat resistance above that temperature, which places a restriction on the substrates that can be used.

From the above, it can be seen that a method for obtaining a metal thin film by applying onto a substrate a dispersion into which metal particles or metal oxide particles are dispersed, then subjecting to heat treatment, has low process costs. However, methods that use metal particles have the drawback that the particle costs are very expensive. In addition, methods that use metal oxide particles require that the particles have been dispersed in the crystalline polymer beforehand, which has the problem that the heating temperature is high in order to burn off the crystalline polymer. Therefore, at present such methods are not used in practice. In particular, at present it is difficult to apply the methods for forming metal thin film onto the resin substrates used in the commercial sector. Meanwhile, it is difficult to obtain a porous metal thin film by heat treatment at a relatively low temperature.

Plating and the slurry method are also known as methods for producing metal oxide porous films. Plating is a method for obtaining a metallic porous body by adhering a carbon powder or the like to the skeleton structure surface of a foam resin such as urethane foam to provide conductivity thereto, depositing a metal layer thereon by plating, then burning off the foam resin and carbon powder to obtain the metallic porous body. However, this method has the drawback that its production step is cumbersome. On the other hand, the slurry method is to obtain a metallic porous body by impregnating or applying a metal powder or metal fiber to the skeleton structure surface of a foam resin such as urethane foam, and thereafter burning off the resin component by heating to sinter the metal powder and obtain the metallic porous body. This method requires that the metal powder or metal fiber, which are its raw materials, are small particles in order to impregnate the porous resin. Generally, particles having a diameter of several tens of μm to several hundreds of μm are used. However, producing a metal powder having a small particle diameter requires a cumbersome production step such as that used in a method of spraying a molten metal or a pulverizing method. Therefore, this method has the drawback that its raw materials are expensive. There is also the danger of fire or explosion due to the small particle diameter-metal powder having a large surface area, which may cause problems with cost overruns for the production equipment. Moreover, since the resultant porous body's pore diameter is reflective of the impregnated foam resin's aperture diameter, the pore diameter is several tens of μm or more.

A method is also known (JP-A-05-195110) for obtaining a metallic porous body by mixing a metal oxide powder, rather than a metal powder, with a resin binder, forming this mixture using a mold into a predetermined shape, then heating the product in an oxidizing atmosphere to burn off the resin binder and obtain a porous metal oxide-sintered body, which is then baked in a reducing atmosphere to obtain the metallic porous body. However, while this method has the advantage of allowing production of a metallic porous body having a small pore diameter of approximately 1 μm from low cost raw materials of metal oxide, the method has the drawback that the production process is cumbersome because it requires a pressure application step. In addition, the resins which can be used as the resin binder are hydrophilic resins such as polyvinyl alcohol resin, butyral resin and acryl resin. A high temperature of 1000° or more is required to completely burn off these binders which are in a pressurized state. Accordingly, this method suffers from a problem in terms of its production equipment, wherein a baking apparatus which can accommodate high temperatures is required.

Mixing a metal oxide powder with an organic binder then baking in a reducing environment without pressure molding, does allow the binder to be removed at a lower temperature, for example 700° C. when polyvinyl alcohol is used as the binder, since the organic binder is not in a compressed environment (see JP-A-2000-500826). However, because the metal oxide particles are not compressed, fusion of the metal particles obtained by reduction does not proceed, whereby only a granulized metal powder is obtained, and a metallic porous body cannot be achieved.

Thus, at present no methods are known which use a metal oxide as the raw material for obtaining a porous metal thin film at low temperature and having a small pore diameter of 1 μm or less without going through a cumbersome step such as pressurizing.

Therefore, a problem to be solved by the present invention is to provide a metal oxide dispersion that can form a thin film having high adherence to a substrate, and a process for producing a metal thin film onto a substrate which uses this metal oxide dispersion, at low cost and using a low temperature heat treatment. Another problem is also to provide a production process for obtaining a porous metal thin film.

DISCLOSURE OF THE INVENTION

The inventor achieved the present invention after extensive investigations to resolve the above problems.

Namely, the present invention is as follows.

1. A metal oxide dispersion comprising a metal oxide having a particle diameter of less than 200 nm and a dispersion medium, wherein the metal oxide dispersion medium comprises a polyhydric alcohol and/or a polyether compound.

2. The metal oxide dispersion according to the above item 1, wherein the polyhydric alcohol has 10 or less carbon atoms.

3. The metal oxide dispersion according to the above item 1 or 2, wherein the polyhydric alcohol is a sugar alcohol.

4. The metal oxide dispersion according to any one of the above items 1 to 3, wherein the polyether compound is an aliphatic polyether having repeating units of a straight chain or a cyclic oxyalkylene group having 2 to 8 carbon atoms.

5. The metal oxide dispersion according to any one of the above items 1 to 4, wherein a molecular weight of the polyether compound is 150 or more and 6000 or less.

6. The metal oxide dispersion according to the above item 5, wherein the polyether compound is a polyethylene glycol and/or polypropylene glycol having a molecular weight of 250 or more and 1500 or less.

7. The metal oxide dispersion according to any one of the above items 1 to 6, wherein a volume resistivity of a metal obtained by reducing a metal oxide is $1 \times 10^{-4}$ Ωcm or less.

8. The metal oxide dispersion according to any one of the above items 1 to 7, wherein the metal oxide is copper oxide or silver oxide.

9. The metal oxide dispersion according to the above item 8, wherein the metal oxide is cuprous oxide.

10. The metal oxide dispersion according to any one of the above items 1 to 9, wherein the content of metal oxide is 5 to 90% by weight of the overall weight of the metal oxide dispersion.

11. The metal oxide dispersion according to any one of the above items 1 to 10, wherein the metal oxide dispersion comprises a metal powder in an amount that the total weight of the metal powder and metal oxide fine particles occupies 5% by weight or more and 95% by weight or less of the overall weight of the metal oxide dispersion.

12. The metal oxide dispersion according to the above item 11, wherein the metal powder includes at least one metal species selected from the group consisting of gold, silver, copper, palladium, platinum, nickel, chromium, aluminum, tin, zinc, titanium, tungsten, tantalum, barium, rhodium, ruthenium, osmium, bismuth, iridium, cobalt, indium, iron and lead.

13. The metal oxide dispersion according to any one of the above items 1 to 12, wherein the metal oxide dispersion comprises a thermosetting resin in an amount of 0.1 to 20% by weight of the overall weight of the metal oxide dispersion.

14. The metal oxide dispersion according to any one of the above items 1 to 13, wherein the metal oxide dispersion comprises a reducing agent, which can reduce the metal oxide and is other than a polyhydric alcohol and a polyether compound, in an amount of 0.1 to 70% by weight of the overall weight of the metal oxide dispersion.

15. The metal oxide dispersion according to any one of the above items 1 to 14, wherein the content of polyhydric alcohol is 0.1% by weight or more and 95% by weight or less of the overall weight of the metal oxide dispersion.

16. The metal oxide dispersion according to any one of the above items 1 to 15, wherein the content of polyether compound is 0.1% to 70% by weight of the overall weight of the metal oxide dispersion.

17. The metal oxide dispersion according to any one of the above items 1 to 15, wherein the content of polyether compound is less than 0.1% by weight of the overall weight of the metal oxide dispersion.

18. A metal thin film formed by fusing contacting portions of a plurality of gathered metal fine particles having a primary diameter of less than 200 nm obtained by baking the metal oxide dispersion according to the above item 16.

19. A metal thin film having a porous structure formed by fusing contacting portions of a plurality of gathered metal fine particles having a primary diameter of less than 200 nm obtained by baking the metal oxide dispersion according to the above item 17.

20. A method of producing a metal thin film which comprises applying the metal oxide dispersion according to any one of the above items 1 to 16 onto a substrate, then carrying out heat treatment.

21. The method of producing a metal thin film according to the above item 20, which comprises carrying out heat treatment in a non-oxidizing atmosphere.

22. The method of producing a metal thin film according to the above item 20, which comprises applying the metal oxide dispersion onto a substrate, then heating and baking the dispersion in an inert atmosphere, followed by heating and baking in a reducing atmosphere.

23. The method of producing a metal thin film according to any one of the above items 20 to 22, wherein a heat treatment temperature is 50° C. or more and 500° C. or less.

BEST MODE FOR CARRYING OUT THE INVENTION

The present invention will now be described in detail.

As described above, the metal oxide dispersion according to the present invention comprises as essential constituents a metal oxide having a particle diameter of 200 nm or less and a dispersion medium. The metal oxide dispersion according to the present invention is also characterized in that the dispersion medium comprises a polyhydric alcohol and/or a polyether compound. These constituents will be described in the following.

The particle diameter of the metal oxide used in the present invention is less than 200 nm, preferably less than 100 nm and more preferably less than 30 nm. Particle diameter is intended to mean a primary particle diameter, which can be determined by morphological observation using an electron microscope or the like. When the particle diameter is less than 200 nm, it is believed that because the particle diameter of the metal fine particles obtained by reduction of the metal oxide is small, their surface energy becomes large, whereby their melting point is lowered so that the metal particles fuse to each other at low temperature to form a metal thin film. The smaller the metal oxide particles' particle diameter is, the more easily the metal oxide particles are reduced. Thus, in terms of an ease of reduction, smaller metal oxide particles are preferable. When the particle diameter of the metal oxide is more than 200 nm, fusing of the metal particles obtained by reduction treatment is not sufficient, whereby a dense and strong structure cannot be achieved. On the other hand, where the particle diameter is less than 100 nm, such particles can be used as a conductive ink for an ink-jet method for forming fine wires by extruding fine droplets, which is preferable when forming a fine pitch circuit without an etching process.

Any metal oxide may be used as long as it is reduced by heat treatment. The individual metal oxide particles may consist of a single metal oxide or may be a composite metal oxide consisting of a plurality of metal oxides. A volume resistivity of the metal obtained by reducing the metal oxide is preferably $1 \times 10^{-4}$ Ωcm or less and more preferably $1 \times 10^{-5}$ Ωcm or less. Such a metal oxide is used preferably because the electrical conductivity for the obtained metal thin film is high. Such metal oxides include, for example, silver oxide, copper oxide, palladium oxide, nickel oxide, lead oxide, and cobalt oxide. Among these, copper oxide and silver oxide are particularly preferable as they can be easily reduced and have high electrical conductivity after being reduced. Silver oxide includes silver (I) oxide, silver (II) oxide and silver (III) oxide. While there are no restrictions on the oxidation state of the silver, in terms of powder stability, silver (I) oxide is more preferable. Copper oxide includes cuprous oxide and cupric oxide. While there are no restrictions on the oxidation state of the copper, in terms of the ease of reducing to metallic copper, cuprous oxide is particularly preferable.

These metal oxide can be commercially available products, or can be synthesized using a known synthesis method. Commercially available products include cupric oxide fine particles from C.I. Kasei Co., Ltd. having average particle diameter of about 30 nm (nominal). Known methods for synthesis of a cuprous oxide having a particle diameter of less than 200 nm include a synthesis method which involves heating an acetylacetonato copper complex in a polyol solvent at approximately 200° C. (Angevandte Chemie International Edition, No. 40, Vol. 2, p. 359, 2001) and a method which involves heating an organocopper compound (copper-N-nitrosophenyl hydroxylamine complex) at a high temperature of approximately 300° C. in an inert atmosphere in the presence of a protective agent such as hexadecyl amine (Journal of American Chemical Society 1999, Vol. 121 p. 11595).

The metal oxide used in the present invention has a particle diameter of 200 nm or less, and as far as fusion of the particles during heat treatment is not prevented, part of the metal oxide particles may be replaced with a material other than a reducible metal oxide. Here, a "a material other than a reducible metal oxide" is, for example, a metal, or a metal oxide that is not reduced under heating at 500° C. or less, or an organic compound. Examples thereof include a core-shell type metal-metal oxide complex fine particles, wherein the center portion is a metal and the surface thereof is covered by a metal oxide.

The metal oxide fine particles used in the present invention may be weakly agglomerated with each other in the metal oxide dispersion. However, when applied in screen printing or the like, it is preferable to be able to redisperse before printing so that the agglomerate does not cause clogging on the screen. For uses such as applying by inkjet process, the agglomerate diameter is preferably less than 100 nm. These agglomerates are known as secondary agglomerates, and their particle diameter can be determined by laser scattering method.

The weight of the metal oxide is 5% by weight or more to 95% by weight or less of the overall weight of the metal oxide dispersion. Preferably, it is 10% by weight or more to 80% by weight or less. When it is less than 5% by weight, the film thickness of the metal thin film obtained from one application and baking is thin. On the other hand, when the weight is more than 95% by weight, the viscosity of the dispersion becomes too high, making it difficult to apply onto the substrate.

The dispersion medium used in the present invention is an organic solvent and/or water. Examples of the organic dispersion medium include liquid alcohol solvents, ketone solvents, amide solvents, ester solvents and ether solvents.

Examples of the alcohol solvents include monohydric alcohols such as methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethylbutanol, sec-heptanol, 3-heptanol, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, and diacetone alcohol; polyhydric alcohols such as ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, hexanediol, octanediol, triethylene glycol, tripropylene glycol and glycerol; and partial ethers of polyhydric alcohols, such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, and dipropylene glycol monopropyl ether. These alcohol solvents may be used alone or in combination of two or more thereof.

Examples of the ketone solvents include acetone, methyl ethyl ketone, methyl n-propyl ketone, methyl n-butyl ketone, diethyl ketone, methyl i-butyl ketone, methyl n-pentyl ketone, ethyl n-butyl ketone, methyl n-hexyl ketone, di-1-butyl ketone, trimethylnonanone, cyclohexanone, 2-hexanone, methylcyclohexanone, 2,4-pentanedione, acetonylacetone, and acetophenone. Examples thereof further include β-diketones such as acetylacetone, 2,4-hexanedione, 2,4-heptanedione, 3,5-heptanedione, 2,4-octanedione, 3,5-octanedione, 2,4-nonanedione, 3,5-nonanedione, 5-methyl-2,4-hexanedione, 2,2,6,6-tetramethyl-3,5-heptanedione, and 1,1,1,5,5,5-hexafluoro-2,4-heptanedione.

Examples of the amide solvents include formamide, N-methylformamide, N,N-dimethylformamide, N-ethylformamide, N,N-diethylformamide, acetamide, N-methylacetamide, N,N-dimethylacetamide, N-ethylacetamide, N,N-diethylacetamide, N-methylpropionamide, N-methylpyrrolidone, N-formylmorpholine, N-formylpiperidine, N-formylpyrrolidine, N-acetylmorpholine, N-acetylpiperidine, and N-acetylpyrrolidine.

Examples of the ester solvents include diethyl carbonate, ethylene carbonate, propylene carbonate, diethyl carbonate, methyl acetate, ethyl acetate, γ-butyrolactone, γ-valerolactone, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxytriglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, and diethyl phthalate. These ester solvents may be used alone or in combination of two or more thereof.

Examples of the ether solvents include dipropyl ether, diisopropyl ether, dioxane, tetrahydrofuran, tetrahydropyran, ethylene glycol dimethyl ether, ethylene glycol diethyl ether, ethylene glycol dipropyl ether, propylene glycol dimethyl ether, propylene glycol diethyl ether, propylene glycol dipropyl ether, diethylene glycol dimethyl ether, diethylene glycol diethyl ether and diethylene glycol dipropyl ether.

These dispersion media may be used alone or in combination of two or more thereof. In particular, for an inkjet application, it would be preferable if a metal oxide having a particle diameter of less than 200 nm can be uniformly dispersed, and if the metal oxide dispersion has a low viscosity.

The metal oxide dispersion according to the present invention must comprise a polyhydric alcohol and/or polyether compound in its dispersion medium. The polyhydric alcohol and/or polyether compound may be a solid or a liquid. When the polyhydric alcohol and/or polyether compound contained in the metal oxide dispersion is a solid, it may be used by dissolving it in the above-described dispersion medium of organic solvent and/or water. On the other hand, when the polyhydric alcohol and/or polyether compound contained in the metal oxide dispersion is a liquid, it can serve as the dispersion medium by itself.

In the present invention "polyhydric alcohol" is intended to mean a compound which has 2 or more hydroxyl groups, and "polyether compound" is intended to mean a compound which has 2 or more ether bonds. Compounds that have 2 or more hydroxyl groups and 2 or more ether bonds will be classified into one of the two according to the following criteria: (i) where the subject compound has more hydroxyl groups (hereinafter "n1") than ether bonds (hereinafter "n2"), i.e. where n1>n2, the subject compound is classified into a polyhydric alcohol and (ii) where n1<n2, or n1=n2, the subject compound is classified into a polyether compound. For example, according to these criteria maltotriose, which is a type of trisaccharide, has on its skeleton structure 11 hydroxyl groups and 5 ether bonds. Therefore, according to the above criteria, it is classified into a polyhydric alcohol. As another example, triethylene glycol, which has 2 hydroxyl groups and 2 ether bonds on its skeleton structure, is classified as a polyether compound.

Having a polyhydric alcohol in the metal oxide dispersion improves the dispersibility of the metal oxide particles in the same dispersion. Examples of such a polyhydric alcohol include ethylene glycol, diethylene glycol, 1,2-propane diol, 1,3-propane diol, 1,2-butane diol, 1,3-butane diol, 1,4-butane diol, 2-butene-1,4-diol, 2,3-butane diol, pentane diol, hexane diol, octane diol, 1,1,1-trishydroxymethylethane, 2-ethyl-2-hydroxymethyl-1,3-propane diol, 1,2,6-hexane triol, 1,2,3-hexane triol and 1,2,4-butane triol. In addition, sugar alcohols such as glycerol, threitol, erythritol, pentaerythritol, a pentitol and a hexitol can also be used, wherein pentitol includes xylitol, ribitol and arabitol. Further, hexitol includes mannitol, sorbitol and dulcitol. Sugars such as glyceric aldehyde, dioxy acetone, threose, erythrulose, erythrose, arabinose, ribose, ribulose, xylose, xylulose, lyxose, glucose, fructose, mannose, idose, sorbose, gulose, talose, tagatose, galactose, allose, altrose, lactose, xylose, arabinose, isomaltose, glucoheptose, heptose, maltotriose, lactulose and trehalose can also be used. Because these polyhydric alcohols are reducing, they are preferable when reducing the metal oxide.

Particularly preferable polyhydric alcohols are those having 10 or less carbon atoms. Among them, those alcohols which are liquid-state and have low viscosity are preferable, because as described-above, they can serve as the dispersion medium by themselves. Examples of such polyhydric alcohols include ethylene glycol, diethylene glycol, 1,2-propane diol, 1,3-propane diol, 1,2-butane diol, 1,3-butane diol, 1,4-butane diol, 2,3-butane diol, pentane diol, hexane diol and octane diol.

Among the polyhydric alcohols, the sugar alcohols such as glycerol, threitol, erythritol, pentaerythritol, pentitol and hexitol are preferable, as they particularly improve resistance to agglomeration of the metal oxide fine particles in the metal oxide dispersion.

The polyhydric alcohol is preferably added in an amount of 0.1% by weight or more and 95% by weight or less of the overall weight of the metal oxide dispersion, and more preferably 1% by weight or more and 90% by weight or less. If the amount is less than 0.1% by weight, the increase in dispersibility of the metal oxide particles is small. An amount greater than 95% is not preferable because the amount of metal oxide in the dispersion becomes small, thus making it difficult to form a good quality metal thin film. These polyhydric alcohols may be used alone or in combination of two or more thereof.

Having a polyether compound in the metal oxide dispersion improves the denseness of the metal thin film obtained by baking of the same dispersion, and the adhesiveness to the substrate also improves. A polyether compound is a compound that has an ether bond in its skeleton structure. Preferably, it is homogeneously dispersed in the dispersion medium. The microscopic structure of the metal thin film may differ depending on whether or not polyether compounds derived from the metal oxide dispersion are contained in the metal oxide dispersion. When the amount of polyether compound in the metal oxide dispersion is less than 0.1% by weight of the overall weight of the metal oxide dispersion, the obtained thin film is a porous metal thin film with a pore structure having a pore diameter of 1 µm or less. On the other hand, when the amount of polyether compound in the metal oxide dispersion is 0.1% by weight or more and 70% by weight or less of the overall weight of the metal oxide dispersion, the obtained metal thin film has only a few holes, and those holes are small, thus denseness is improved.

It is not established why the denseness and adhesiveness of the metal thin film obtained by baking are improved by adding a polyether compound to the metal oxide dispersion. However, it is believed that this might be due to localized granulation of the metal oxide particles being prevented during the course of baking, and also that a tiny amount of polyether compound itself remains as a binder, or is reduced to carbon to be a binder in the metal thin film, or at the boundary between the thin film and the substrate.

In addition, polyether compounds are easily decomposed by the metal obtained from reduction of the metal oxide. In particular, in an atmosphere where a reducing gas such as hydrogen coexists, the polyether compound is preferable because it tends to be catalytically decomposed at a low temperature, whereby it easily disappears. Because polyether compounds themselves are reducing, they are preferable when reducing a metal oxide.

Amorphous polyether compounds are preferable in terms of dispersibility into the dispersion medium of the metal oxide fine particles. Among those, aliphatic polyethers are preferable in which in particular the repeating units are straight chains or cyclic oxyalkylene groups having 2 to 8 carbon atoms. The molecular structure of an aliphatic polyether with repeating units of straight chains or cyclic oxyalkylene groups having 2 to 8 carbon atoms may be a ring, a straight chain or a branched chain structure, and may be a binary or higher polyether copolymer or may be a binary or higher polyether block copolymer. Specific examples thereof include polyether homopolymers such as polyethylene glycol, polypropylene glycol and polybutylene glycol; binary copolymers such as ethylene glycol/propylene glycol and ethylene glycol/butylene glycol copolymers, and straight chain ternary copolymers such as ethylene glycol/propylene glycol/ethylene glycol, propylene glycol/ethylene glycol/propylene glycol and ethylene glycol/butylene glycol/ethylene glycol ternary copolymers, although the polyether is not limited thereto. The polyether block copolymers include binary block copolymers, such as a polyethylene glycol/polypropylene glycol and a polyethylene glycol/polybutylene glycol, and straight chain, ternary block copolymers, such as a polyethylene glycol/polypropylene glycol/polyethylene glycol, a polypropylene glycol/polyethylene glycol/polypropylene glycol and a polyethylene glycol/polybutylene glycol/polyethylene glycol.

Polyether compounds used in the present invention may comprise other functional groups in their molecular structure, such as an alcohol group, ester group, glycidyl group, imide group, alkyl group, amide group, ester group, amino group, phenyl group, aldehyde group, carbonate group, isocyanate group and sulfonic acid group. The polyether compounds may also comprise a substituent combining these groups, such as an alkyl ester group, an alkylamide group and an alkyl carbonate group, although they are not limited thereto. They may also comprise a polymerizable vinyl group, vinylidene group, vinylene group, glycidyl group, allyl group and acrylate group or methacrylate group comprising these groups. There may be a plurality of these functional groups in the molecule. For example the molecule may comprise a polyhydric alcohol group such as a sugar or sugar alcohol.

Examples of the structure of the polymer chains bonded to the hydroxyl group contained in the sugar alcohol include glycerol polyethylene glycol polypropylene glycol and erythritol polyethylene glycol polypropylene glycol polyethylene glycol, wherein the polymer chain is bonded to a hydroxyl group contained in glycerol, threitol, erythritol, pentaerythritol, pentitol, hexitol and the like. Specific examples of the sugar chain include glyceric aldehyde, dioxy acetone, threose, erythrulose, erythrose, arabinose, ribose, ribulose, xylose, xylulose, lyxose, glucose, fructose, mannose, idose, sorbose, gulose, talose, tagatose, galactose, allose, altrose, lactose, xylose, isomaltose, glucoheptose, heptose, maltotriose, lactulose, trehalose and the like.

The terminal group of the aliphatic polyether used in the present invention is not particularly limited, and may include a group modified by a hydroxyl group, a straight chain, branched or cyclic alkyl ether, an alkyl ester group, an alkylamide group, an alkylcarbonate group, a urethane group or a trialkylsilyl group and the like having 1 to 8 carbon atoms. Specific examples of such modified aliphatic polyether terminal groups will be described in the following.

Examples of alkyl etherification of at least one terminal include ethers such as methyl ether, ethyl ether, propyl ether and glycidyl ether. Specific example thereof include polyethylene glycol monomethyl ether, polyethylene glycol dimethyl ether, polypropylene glycol dimethyl ether, polyisobutylene glycol dimethyl ether, polyethylene glycol diethyl ether, polyethylene glycol monoethyl ether, polyethylene glycol dibutyl ether, polyethylene glycol monobutyl ether, polyethylene glycol diglycidyl ether, polyethylene polypropylene glycol dimethyl ether, glycerin polyethylene glycol trimethyl ether, pentaerythritol polyethylene glycol tetramethyl ether, pentitol polyethylene glycol pentamethyl ether, sorbitol polyethylene glycol hexamethyl ether and the like.

Examples of aliphatic polyethers which have terminal ester group(s), wherein at least one terminal thereof is modified with an ester, include those modified with an acetic ester, a propionic ester, an acrylic ester, a methacrylic ester, or a benzoic ester. It is also preferred that the terminal of an alkylene glycol is modified with a carboxymethyl ether, and the carboxyl group of the terminal is modified with an alkyl ether. Specific preferred examples of such aliphatic polyethers include a polyethylene glycol monoacetate, a polyethylene glycol diacetate, a polypropylene glycol monoacetate, a polypropylene glycol diacetate, a polyethylene glycol dibenzoate, a polyethylene glycol diacrylate, a polyethylene glycol monomethacrylate, a polyethylene glycol dimethacrylate, a polyethylene glycol biscarboxymethyl ether dimethyl ester, a polypropylene glycol biscarboxymethyl ether dimethyl ester, a glycerol polyethylene glycol triacetate, a pentaerythritol polyethylene glycol tetraacetate, a pentitol polyethylene glycol pentaacetate and a sorbitol polyethylene glycol hexaacetate.

Examples of aliphatic polyethers which have a terminal amide group include those which are obtained by a method comprising modifying at least one terminal with a carboxymethyl ether, followed by amidation; and those which are obtained by a method comprising modifying a hydroxyl terminal with an amino group, followed by amidation. Specific preferred examples of such aliphatic polyethers include a polyethylene glycol bis(carboxymethyl ether dimethylamide), a polypropylene glycol bis(carboxymethyl ether dimethylamide), a polyethylene glycol bis(carboxymethyl ether diethylamide), a glycerol polyethylene glycol tri(carboxymethyl ether dimethylamide), a pentaerythritol polyethylene glycol tetra(carboxymethyl ether dimethylamide), a pentitol polyethylene glycol penta(carboxymethyl ether dimethylamide) and a sorbitol polyethylene glycol hexa(carboxymethyl ether dimethylamide).

Examples of aliphatic polyethers which have a terminal alkylcarbonate group include those which are obtained by bonding a formyl ester group to at least one terminal of, for example, the above-mentioned polyalkylene glycol. Specific examples of such aliphatic polyethers include a bis(methoxycarbonyloxy) polyethylene glycol, a bis(ethoxycarbonyloxy) polyethylene glycol, a bis(ethoxycarbonyloxy) polypropylene glycol and a bis(tert-butoxycarbonyloxy) polyethylene glycol.

Aliphatic polyethers modified with a urethane group or a trialkylsilyl group at a terminal can also be used. With respect to the modification with a trialkylsilyl group, especially preferred is a modification with a trimethylsilyl group. Such a modification can be conducted by using trimethylchlorosilane, trimethylchlorosilylacetoamido, hexamethyldisilazane or the like.

In terms of solubility and dispersibility of the metal oxide fine particles into the dispersion medium, the most preferable terminal group of the aliphatic polyether is a hydroxyl group. Polyether compounds which have a low molecular weight and are in a liquid state can be used by themselves as the dispersion medium.

To obtain a metal thin film having high conductivity by baking a metal oxide dispersion which comprises a polyether compound, the polyether compound is preferably burned off by baking it at a low temperature, a preferable molecular weight thereof is 150 to 6000, and a more preferable molecular weight is in the range of 250 to 1500. If the molecular weight of the polyether compound being used is too high, it becomes difficult to burn it off during baking, whereby a large amount of the polyether compound remains in the metal thin film. If there is a large amount of polyether compound remaining in the metal thin film, there may be problems with the volume resistivity of the metal thin film increasing and the like. Moreover, a polyether compound's molecular weight that is too large is not preferable because dispersibility into the dispersion medium is not sufficient. If the molecular weight is too small, the film forming property and denseness of the metal thin film obtained by heat treatment is reduced, which is also not preferable.

The amount of polyether compound added to the metal oxide dispersion is 0.1 to 70% by weight of the overall weight of the metal oxide dispersion, and more preferably 1 to 50% by weight. When the amount of polyether compound added is less than 0.1% by weight, the denseness of the metal films of the metal obtained by reduction of the metal oxide becomes lower, and adhesiveness to the substrate also tends to decrease. When the amount of polyether compound added exceeds 70% by weight, the viscosity of the metal oxide dispersion tends to increase, which is not preferable.

A general method for dispersing powder into a liquid can be used to disperse the metal oxide dispersion into the dispersion medium. Examples of such a method include a supersonic method, a mixer method, a three rolled mixer method, a two rolled mixer method, an attritor, a Banbury mixer, a paint shaker, a kneader, an homogenizer, a ball mill and a sand mill. Usually, dispersion is carried out using a plurality of these dispersion means. When the polyhydric alcohol (and/or polyether compound) is a liquid, the polyhydric alcohol (and/or polyether compound) and the metal oxide can be added to the dispersion medium for dispersion at the same time. When the polyhydric alcohol (and/or polyether compound) is a solid, it is preferable to first dissolve the polyhydric alcohol (and/or polyether compound) in the dispersion medium, then add the metal oxide to this solution for dispersion. These dispersion treatments can be carried out at room temperature, and may also be heated to lower the solvent viscosity. Metal oxide dispersion treatment may be omitted by synthesizing a metal oxide having a particle diameter of less than 200 nm in the dispersion medium used in the present invention.

It is particularly preferable to use in the metal oxide dispersion polyhydric alcohols having 10 or less carbon atoms as the dispersion medium, and to include an above-described polyether compound in the dispersion medium.

A metal powder is preferably incorporated into the metal oxide dispersion in addition to the metal oxide particles, as the characteristics of the metal junction layer obtained by heat treatment are improved, and it is possible to reduce the amount of metal oxide fine particles used. There are no particular restrictions on the metal powder which may be used, and such examples include gold, silver, copper, palladium, platinum, nickel, chromium, aluminum, tin, zinc, titanium, tungsten, tantalum, barium, rhodium, ruthenium, osmium, bismuth, iridium, cobalt, indium, iron, lead and the like. One or more metal powders may be selected depending on the objective. When high conductivity is sought, silver, nickel and copper are in particular preferably used as they can be cheaply obtained industrially. Silver is also preferable as it has the effect of providing high oxidation resistance to the metal thin film. Further, when resistance to migration is required at the metal junction layer, a large amount of copper may be added, as it has strong migration resistance.

There are no particular restrictions on the particle diameter of these metal powders, so that depending on the application a metal powder having a preferable diameter may be used. When obtaining the metal thin film by baking, the preferable diameter of the metal powder is 100 μm or less, and 10 μm or less is more preferable. When the metal powder diameter is more than 100 μm, the difference in size between the metal powder and the metal oxide fine particles is too large. This is not preferable because the smoothness of the metal junction layer decreases. When the metal oxide dispersion is used for an inkjet ink, the metal powder diameter is preferably 200 nm or less, and more preferably 100 nm or less.

The amount of metal powder that is added to the metal oxide dispersion is preferably such that the total content of the metal powder and the metal oxide fine particles is 5% by weight or more and 95% by weight or less of the overall weight of the metal oxide dispersion. The weight ratio of the metal powder to the metal oxide fine particles is preferably 9:1 to 1:9. When the total content of the metal powder and the metal oxide fine particles to be added is less than 5% by weight, the additive effect is small, and when it exceeds 95% in weight, the viscosity of the metal oxide dispersion increases, which is not preferable because it is difficult to apply and fill the dispersion. When the weight ratio of the metal powder to the metal oxide fine particles deviates from the 9:1 to 1:9 range, the effects of mixing the two types of particles becomes small, which are not preferable.

It is preferable to add a thermosetting resin to the above metal oxide dispersion, since adhesiveness to the metal surface is improved by the heat curing, and strength also increases. Thermosetting resins that can be used are not particularly limited, as long as they can dissolve in the dispersion medium to be used, and are not detrimental to the dispersibility of the metal oxide dispersion. Examples thereof include an epoxy resin, a phenol resin, a resol resin, a polyimide, a polyurethane, a melamine resin, a urea resin, a polyimide resin and the like.

Examples of the epoxy resin include a bisphenol A epoxy resin, a bisphenol F epoxy resin, a (cresol) novolak epoxy resin, a halogenated bisphenol epoxy resin, a resorcin epoxy resin, a tetrahydroxyphenyl ethane epoxy resin, a polyalcohol polyglycol epoxy resin, a glycerol triethyl epoxy resin, a polyolefin epoxy resin, an epoxidized soybean oil, a cyclopentadiene dioxide, a vinylcyclohexene dioxide and the like.

Liquid epoxy resins preferably have a low viscosity. Examples thereof include phenoxyalkyl monoglycidyl ether, bisphenol A diglycidyl ether, proplyene glycol diglycidyl ether, polyproplyene glycol diglycidyl ether, hexanediol diglycidyl ether, hydrogenated bisphenol A diglycidyl ether, neopentyl glycol diglycidyl ether, glycerol diglycidyl ether, N,N-diglycidylaniline, N,N-diglycidyl toluidine, trimethylolpropane triglycidyl ether, glycerol triglycidyl ether and the respective polysiloxane diglycidyl ether of the liquids.

Among the liquid epoxy resins, alcohol epoxy resins which can disperse well in a polyhydric alcohol dispersion medium are preferably used. Examples thereof include polyethylene glycol diglycidyl ether, polyproplyene glycol diglycidyl ether, 1,4-butanediol diglycidyl ether and the like.

In the present invention, a general epoxy curing agent may be used as the epoxy curing agent. Examples thereof include aliphatic polyamines such as a triethylenetetramine and an m-xylene diamine; aromatic amines such as a m-phenylenediamine and a diaminodiphenylsulfone; tertiary amines such as a benzyldimethylamine and a dimethylamino methylphenol; acid anhydrides such as a phthalic anhydride and a hexahydro phthalic anhydride; and boron trifluoride amine complexes such as a BF3-piperidine complex. In addition bisphenol compounds such as bisphenol A can also be used. A dicyandiamide, 2-ethyl-4-methylimidazole or tris(methylamino)silane may also be used. Examples of resin curing agents include polyamide resins prepared from a linolenic acid dimer and an ethylene diamine and the like; polysulfide resins having a mercapto group on both terminals, a novolak phenol resin and the like. These may be used alone or in combination of two or more thereof.

An added amount of the curing agent differs depending on the curing agent. When the agent reacts stoichiometrically with the glycidyl group, such as for an anhydride, the optimum added amount is determined from the epoxy equivalent amount. When the agent reacts catalytically, 3 to 30% by weight is typical. When the room temperature reactivity of these curing agents is high, the liquid containing the initiator may be mixed to the adhesive just before use, or the curing agent may be a microcapsule encapsulated in an approximately 100 μm gelatin capsule or the like.

Polyimide resins, which are another example of the thermosetting resin, may be obtained by heat condensating a polyamide acid solution, which is a precursor thereof. Polyamide acids which may be used in the present invention can be prepared from a tetracarboxylic acid dianhydride and diamino compound. Examples of the tetracarboxylic acid dianhydride include pyromellitic acid dianhydride, 3,3', 4,4'-benzophenone tetracarboxylic acid dianhydride, 1,4,5,8-naphthalene tetracarboxylic acid dianhydride, 2,3,6,7-naphthalene tetracarboxylic acid dianhydride, 1,2,5,6-naphthalene tetracarboxylic acid dianhydride, 3,3',4,4'-biphenyl tetracarboxylic acid dianhydride, 2,2',3,3'-biphenyl tetracarboxylic acid dianhydride, 2,3,3',4'-biphenyl tetracarboxylic acid dianhydride, 2,3,3', 4'-benzophenone tetracarboxylic acid dianhydride, 2,2-bis(3,4-dicarboxyphenyl) propane dianhydride and 2,2-bis[5-(3,4-dicarboxyphenoxy) phenyl] propane dianhydride. Examples of the diamino compound include m-phenylenediamine, p-phenylenediamine, 2,4-tolylenediamine, 3,3'-diaminodiphenyl ether, 3,4'-diaminodiphenyl ether, 4,4'-diaminodiphenyl ether, 3,3'-diaminodiphenylsulfone, 4,4'-diaminodiphenylsulfone, 3,4'-diaminodiphenylsulfone, 3,3'-diaminodiphenylmethane, 4,4'-diaminodiphenylmethane, 3,4'-diaminodiphenylmethane, 4,4'-diaminodiphenylsulfide, 3,3'-diaminodiphenylketone, 4,4'-diaminodiphenylketone, 3,4'-diaminodiphenylketone, 2,2'-bis(4-aminophenyl)propane and the like.

In the present invention, the amount of the thermosetting resin that is added to the metal oxide dispersion is preferably 0.1 to 20% by weight of the overall weight of the dispersion medium, polyether compound and thermosetting resin, and more preferably 1 to 10% by weight. If the amount of thermosetting resin is less than 0.1% by weight the additive effect is small. Further, an amount exceeding 20% is unsuitable as a metal thin film forming material, because metal junction layer conductivity markedly decreases.

In the present invention, the polyhydric alcohol and polyether compound, which are both reducing agent, have the effect of reducing the metal oxide. However, it is preferable if a reducing agent capable of reducing the metal oxide is added to the metal oxide dispersion in addition to the polyhydric alcohol and polyether compound, because the metal oxide can be reduced even more easily. Such a reducing agent is not particularly limited, and may be an organic reducing agent or an inorganic reducing agent, so long as it is able to reduce the metal oxide. Examples of an inorganic reducing agent include hydrides such as sodium borohydride and lithium borohydride; sulfur compounds such as sulfur dioxide; the salt of lower oxides such as sulfite; hydrogen iodide; carbon and the like.

Examples of organic reducing agents other than a polyhydric alcohol or a polyether compound include aldehydes, hydrazines, diimides and oxalic acids. Examples of aldehydes include aliphatic saturated aldehydes such as formaldehyde, acetaldehyde, propionaldehyde, butyraldehyde, isobutylaldehyde, valeraldehyde, isovaleraldehyde, pivalinaldehyde, capronaldehyde, heptaldehyde, caprylaldehyde, pelargonic aldehyde, undecylaldehyde, lauraldehyde, tridecylaldehyde, myristate aldehyde, pentadecylaldehyde, palmitaldehyde, margarin aldehyde and stearin aldehyde; aliphatic dialdehydes such as glyoxal and succindialdehyde; aliphatic unsaturated aldehydes such as acrolein, crotonaldehyde and propiolaldehyde; aromatic aldehydes such as benzaldehyde, o-tolualdehyde, m-tolualdehyde, p-tolualdehyde, salicylaldehyde, cinnamaldehyde, α-naphthaldehyde and β-naphthaldehyde; and heterocyclic aldehydes such as furfural.

The diimides can be obtained by thermally decomposing azodicarboxylate, hydroxylamine-O-sulfonic acid, N-allenesulfonyl hydrazide or N-acylsulfonyl hydrazide. Examples of the N-allenesulfonyl hydrazide or N-acylsulfonyl hydrazide include p-toluenesulfonyl hydrazide, benzenesulfonyl hydrazide, 2,4,6-trisisopropylbenzenesulfonyl hydrazide, chloroacetyl hydrazide, o-nitrobenzenesulfonyl hydrazide, m-nitrobenzenesulfonyl hydrazide and p-nitrobenzenesulfonyl hydrazide.

The content of organic reducing agents other than a polyhydric alcohol or a polyether compound is 0.1 to 70% by weight of the overall weight of the metal oxide dispersion, preferably 0.1 to 50% by weight and more preferably 0.1 to 20% by weight, and still more preferably 1 to 10% by weight.

In the present invention, a metal oxide precursor, such as a metal alkoxide compound, may be added to the metal oxide dispersion to improve the strength of the metal thin film obtained by baking and to improve adhesiveness to the substrate. The metal alkoxide is represented by the general formula $M(OR^1)_n$, where M is a metal element, $R^1$ is an alkyl group and n is the oxidation number of the metal. Examples of M include silcon, titanium, zirconia, aluminum and the like. Examples of the alkyl group include methyl group, ethyl group, i-propyl group, n-butyl group, tert-butyl group and the like. Representative examples of the metal alkoxide compound include silicon compounds such as tetramethoxysilane, tetraethoxysilane, tetra(n-propoxy)silane, tetra(i-propoxy)silane, tetra(n-butoxy)silane, tetra-sec-butoxysilane and tetra-tert-butoxysilane; and titanium compounds such as tetraethoxytitanium, tetra(n-propoxy)titanium, tetra(i-propoxy)titanium, tetra(n-butoxy)titanium, tetra-sec-butoxytitanium and tetra-tert-butoxy titanium. Liquid compounds of these compounds are preferable since they can easily disperse in the metal oxide dispersion. Moreover, compounds which have an organic group $R^2$ directly added to the metal can also be used, such as a metal alkoxide represented by $(R^2)_x(M)$ $(OR^1)_{n-x}$ (where n-x is 1 or more). The organic group $R^2$ is, for example, methyl group, ethyl group, propyl group, phenyl group and butyl group.

A general method can be used as the method for dispersing the materials such as the metal powder, thermosetting resin, reducing agent, alkoxide into the metal oxide dispersion liquid, such as a supersonic method, a mixer method, a three rolled mixer method, a two rolled mixer method, an attriter, a Banbury mixer, a paint shaker, a kneader, an homogenizer, a ball mill and a sand mill. Dispersion of these materials may be carried out at the same time as dispersing the polyhydric alcohol (and/or polyether compound) and the metal oxide into the dispersion medium.

Next, a method for forming a metal thin film onto a substrate (method for forming a laminate comprising a substrate and a metal thin film) using the metal oxide dispersion according to the present invention will be explained.

Either an inorganic or an organic substrate can be used as the substrate. Examples of inorganic substrates that can be used include semiconductor substrates such as a glass substrate, silicon and germanium, and compound semiconductor substrates such as gallium-arsenic and indium-antimony. These semiconductor substrates may be used with a thin film of another material forming thereon. Examples of material for such a thin film include metals, such as aluminum, titanium, chromium, nickel, copper, silver, tantalum, tungsten, osmium, platinum and gold; inorganic compounds, such as silicon dioxide, fluorinated glass, phosphate glass, boron-phosphate glass, borosilicate glass, polycrystalline silicon, alumina, titania, zirconia, silicon nitride, titanium nitride, tantalum nitride, boron nitride, hydrogen silsesquioxane and ITO (indium tin oxide); methyl silsesquioxane; amorphous carbon, fluorinated amorphous carbon and a polyimide.

There are no particular restrictions on the organic substrate which can be used as long as it does not suffer thermal damage at the heating temperature of the metal oxide dispersion. For example substrates such as a polyimide substrate, a polyethylene terephthalate (PET) substrate, an aramid substrate, an epoxy substrate and a fluororesin substrate can be used.

Prior to the formation of a thin film, the surface of the substrate may be treated with a physical procedure such as plasma treatment or electron beam treatment for improving adhesion etc. or treated with a chemical procedure such as adhesion promoter. Examples of the adhesion promoter include substances used as a so-called silane coupling agent, or chelate compounds of aluminum. Especially preferred examples of the adhesion promoter include 3-aminopropyltrimethoxysilane, 3-aminopropyltriethoxysilane, N-(2-aminoethyl)-3-aminopropyltrimethoxysilane, N-(2-aminoethyl)-3-aminopropylmethyldimethoxysilane, vinyltrichlorosilane, vinyltriethoxysilane, 3-chloropropyltrimethoxysilane, 3-chloropropylmethyldichlorosilane, 3-chloropropylmethyldimethoxysilane, 3-chloropropylmethyldiethoxysilane, 3-mercaptopropyltrimethoxysilane, 3-glycidoxypropyltrimethoxysilane, 3-glycidoxypropylmethyldimethoxysilane-, 3-methacryloxypropyltrimethoxysilane, 3-methacryloxypropylmethyldimethoxysilane, hexamethyldisilazane, (ethyl acetoacetate)aluminum diisopropoxide, tris(ethyl acetoacetate)aluminum, bis(ethyl acetoacetate) aluminum monoacetylacetonate, and tris (acetylacetonate) aluminum.

If desired, when the adhesion promoter is applied onto a substrate, other additives may be added to the agent, and the agent may be diluted with a solvent. The treatment by the adhesion promoter may be conducted by a known method.

To improve adhesion for an organic substrate, the organic substrate may be subjected to immersion in an aqueous alkaline solution then heated. For example, for a polyimide resin, it is known that by treating in an approximately 5 M potassium hydroxide solution for about 5 minutes the carboxyl groups generated by the cleaving of the imide ring provide an anchor effect.

To form a metal thin film on a substrate using the metal oxide dispersion according to the present invention, the metal oxide dispersion is first applied onto the substrate. The application method may be a method commonly used for applying a dispersion onto a substrate, such as a screen printing method, a dip coating method, a spray application method, a spin coating method and an inkjet method. The applied thickness when the dispersion is applied onto the substrate is preferably 0.1 to 100 μm, and more preferably 1 to 30 μm.

Once the dispersion is applied onto the substrate, the substrate with the dispersion applied thereon is subjected to heat treatment at a temperature enough to reduce the metal oxide to the metal, whereby a metal thin film is formed on the substrate. When the obtained metal thin film is easily oxidized, it is preferable to carry out the heat treatment in a non-oxidizing atmosphere. When the metal oxide is not easily reduced by only the reducing agents in the metal oxide dispersion (the polyhydric alcohol, polyether compound and any reducing agent additionally added other than the polyhydric alcohol and polyether compound), it is preferable to bake in a reducing atmosphere. It is also preferable to carry on baking in a reducing atmosphere after baking in an inert atmosphere, because the denseness of the obtained metal thin film further increases. A non-oxidizing atmosphere is an atmosphere that does not contain oxidizing gases such as oxygen, so that there are an inert atmosphere and a reducing atmosphere. An inert atmosphere is an atmosphere that is full of inert gases such as, for example, argon, helium, neon or nitrogen. A reducing atmosphere means an atmosphere in which reducing gases such as hydrogen or carbon monoxide are present. Baking may be carried out as a closed system by filling the baking furnace with these gases, or may carried out as a flow system while flowing these into the baking furnace. When baking in a non-oxidizing atmosphere, it is preferable to first make the baking furnace into a vacuum to remove oxygen from the baking furnace, then exchange with non-oxidizing gas. Baking may be carried out in a pressurized atmosphere, or in a reduced pressure atmosphere.

A preferred heating temperature during these reducing treatments is 50° C. or more and 500° C. or less, more preferred is 80° C. and more to 400° C. or less and still more preferred is 100° C. or more and 350° C. or less. The polyether compound and/or polyhydric alcohol that is an essential constituent of the metal oxide dispersion according to the present invention can be burned off (or degraded) at such relatively low temperatures. When reducing the metal oxide at a temperature less than 50° C., the storage stability of the metal oxide dispersion tends to worsen, which is not preferable. A temperature of more than 500° C. exceeds the thermal resistance of many organic substrates, which is not preferable because usage becomes impossible on organic substrates. The time required for heat treatment is effected by the type of metal oxide, heating atmosphere and temperature, and by the morphology and size of the dispersion to be heat treated. When copper oxide is used as the metal oxide, 1 to 2 hours is sufficient where the thin film is in the order of micron meters, hydrogen gas is used as the reducing gas without diluting and the heating temperature is set at approximately 200° C. to 300° C.

Even for the same metal oxide, there are cases where a small diameter metal oxide is reduced just by baking in an inert atmosphere, while a large diameter metal oxide requires baking in a reducing atmosphere. This is because a metal oxide having a small particle diameter is more easily reduced than that having a large particle diameter. In such cases it is possible to form a metal thin film without any practical problems by baking in an inert atmosphere.

The metal thin film obtained by baking the metal oxide dispersion according to the present invention has as raw materials metal oxide fine particles having a particle diameter of less than 200 nm. This means that the microscopic structure of the thin film is a structure wherein the primary particle diameter of the less than 200 nm metal fine particles obtained by reducing the metal oxide fine particles of the raw materials have fused together. For more detail on the structure, the metal fine particles having a primary particle diameter of less than 200 nm fuse together to form grains which then contact or fuse to form a thin film. This can be observed using an electron microscope on a baked metal thin film.

The size of the metal grains which are formed by the metal fine particles obtained by reduction of the metal oxide fine particles fusing together is effected by the heat treatment atmosphere and temperature, and the treatment time. Metal grains formed by a high-temperature long-time heat treatment are larger. Metal grains tend to become larger if formed by a heat treatment in a reducing atmosphere. The larger the size of the metal grains, and the smaller the pore structure among metal grains packed densely together, and the less the number of the pore, the more suitable the metal thin film becomes as a conductive thin film, because metal thin film conductivity gets closer to the metal bulk value.

As will be explained in the following, the structure of the metal thin film obtained by baking the metal oxide dispersion depends on the content of polyether compound in the metal oxide dispersion.

The metal grains in a metal thin film obtained by baking a metal oxide dispersion having the content of polyether compound between 0.1 to 70% by weight of the overall weight of the metal oxide dispersion are packed densely, so that the volume resistivity of the metal thin film is close to its metal bulk value. Therefore, for example, such films can be preferably used in implementation fields as wiring material or connecting material that demand a low volume resistivity.

However, a metal thin film obtained by baking a metal oxide dispersion having the content of polyether compound of less than 0.1% by weight of the overall weight of the metal oxide dispersion has a porous structure, which makes its surface volume large and therefore can be preferably used in applications such as an electrode. According to the production process of the present invention, a porous metal thin film can be produced which has a pore diameter of 1 μm or less.

The production process of the metal thin film according to the present invention is a process for obtaining a metal thin film by inter-particle fusion of the particles of the metal fine particles generated by reducing metal oxide fine particles. A pressurizing step is not required, because this process relies on an autonomous fusion attractive force which acts among the particles by reduction. As described above, because the primary particle diameter of the metal oxide fine particles is very small at less than 200 nm, and because the polyether compound and polyhydric alcohol are in themselves reducing, it is thought that the autonomous fusion of among the metal oxide fine particles occurs more easily. In addition, because an organic binder which would be burned off at high temperature is not used, a metal thin film can be produced by the heat treatment at a relatively low temperature. The polyhydric alcohol or polyether compound will be oxidized and be degraded itself and evaporate by being baked at a relatively low temperature, so that such insulating constituents are hard to remain in the metal thin film, whereby volume resistivity of the metal thin film decreases. As also described above, a porous metal thin film can be easily obtained by adjusting the content of polyether compound in the metal oxide dispersion. In addition, by controlling the thickness of the metal oxide dispersion applied onto the substrate, the thickness of the obtained metal thin film can be arbitrarily controlled. This is particularly preferable for uses such as a metal foil attached to resin, as it has the advantage of being able to easily form the ultra thin metal layers which are required when forming fine pitch circuits in particular.

When the metal oxide dispersion comprises a metal powder, a metal thin film, in which the metal fine particles generated by reducing the metal fine particles are fused among the metal powder, can be obtained by baking. Therefore, the metal constituents of the metal thin film obtained in accordance with the present invention are made up of metals which can be obtained by reduction of a metal oxide, and metals which are added as a metal powder. The metals obtained by reduction of a metal oxide and the metals which are added as a metal powder may be either the same or different. Examples of the metals which can constitute the metal thin film include gold, silver, copper, palladium, platinum, nickel, chromium, aluminum, tin, zinc, titanium, tungsten, tantalum, barium, rhodium, ruthenium, osmium, bismuth, iridium, cobalt, indium, iron and lead, wherein the metal thin film comprises at least one of these metals.

The production process of a metal thin film according to the present invention is a process for producing a metal thin film by generating metal fine particles in-situ through baking at a relatively low temperature, then fusing the particles together to form the metal thin film. This process has the advantage that a metal thin film can be produced at low cost, because it uses for its raw materials low cost metal oxide rather than expensive metal fine particles. There is also no need to disperse the metal oxide fine particles beforehand into a special medium (which requires high temperature to degrade) such as a crystalline polymer. This means that a metal thin film can be formed by heat treatment at a relatively low temperature of 500° or less, which therefore has the advantage that the process costs are inexpensive. In other words, the production process of a metal thin film according to the present invention is a process that allows production of a metal thin film by a baking process using low cost raw materials at a low temperature.

EXAMPLES

The present invention will now be specifically described by way of examples. However, the present invention is not to be limited thereto.

The primary particle diameter of copper oxide particles according to the present invention, and the surface morphology of a metal thin film obtained by baking, were determined by observing their surface using a scanning electron microscope (S-4700) manufactured by Hitachi High-Technologies Corporation. The average secondary particle diameter of the metal oxide in the metal oxide dispersion was measured using a laser scattering particle size distribution analyzer (LA-920) manufactured by Horiba, Ltd. Volume resistivity of the metal thin film obtained was determined by a 4-pin probe method using a low resistivity meter Loresta-GP (manufactured by Mitsubishi Chemical Corporation).

Example 1

Preparation of Cupric Oxide Fine Particles Dispersion, and Production Example of a Porous Copper Thin Film 5 g of cupric oxide nanoparticles (particle diameter 10 to 100 nm, nominal average particle diameter 30 nm, manufactured by C.I. Kasei Co., Ltd.) was added to 5 g of diethylene glycol, and the mixture was subjected to a dispersion treatment of 10 minutes on stirring mode and 5 minutes on defoaming mode using a stirring-defoaming machine (HM-500) manufactured by Keyence Corporation to give a cupric oxide fine particle dispersion. The obtained cupric oxide dispersion was applied onto a slide glass so as to have a 2 cm length, 1 cm width, and 20 μm thickness. This slide glass was put into a baking furnace, and after the furnace interior had been vented by a vacuum pump, hydrogen gas was flowed in a flow rate of 1 liter/minute. The temperature of the baking furnace was raised over 1 hour from room temperature to 250° C. Once 250° C. had been reached, heating was continued for another one hour for baking. After cooling, the slide glass was removed. When the slide glass was observed, the obtained copper thin film was a porous thin film having a thickness of 4 μm and a pore diameter of approximately 0.3 μm. This thin film was easily stripped off from the slide glass using scotch tape, and the volume resistivity of this film was $5\times10^{-5}$ Ωcm.

Example 2

Preparation of Cupric Oxide Fine Particles Dispersion, Production Example of a Porous Copper Thin Film A cupric oxide fine particles dispersion was prepared using the same dispersion process as used in Example 1 with the dispersion medium changed to ethylene glycol. The cupric oxide dispersion was hydrogen baked under the same conditions as those of Example 1, except for the baking temperature being changed to 200° C. This thin film was easily stripped off from the slide glass using scotch tape, and the volume resistivity of this film was $6\times10^{-5}$ Ωcm. After cooling, the slide glass was removed, and upon observing the slide glass, a porous copper thin film was formed having a thickness of 4 μm and a pore diameter of approximately 0.2 μm.

Example 3

Preparation of Cupric Oxide Fine Particles Dispersion, Production Example of a Porous Copper Thin Film A cupric oxide fine particles dispersion was prepared using the same dispersion process as used in Example 1, with the dispersion medium changed to a 1:1 mixed dispersion medium of diethylene glycol and water. The baking atmosphere was changed to argon, the baking temperature to 350° C. and the baking furnace was made into a closed system, wherein the temperature of the baking furnace was raised over 1 hour from room temperature to 350° C. Once 350° C. had been reached, heating was continued for another one hour for baking. After cooling, the slide glass was removed. When the slide glass was observed, the obtained copper thin film was a porous thin film having a thickness of 5 μm and a pore diameter of approximately 0.5 μm. This thin film was easily stripped off from the slide glass using scotch tape, and the volume resistivity of this film was $5\times10^{-5}$ Ωcm.

Example 4

Preparation of Cupric Oxide Fine Particles Dispersion, Production Example of a Copper Thin Film A mixture of 5 g of cupric oxide nanoparticles (particle diameter 10 to 100 nm, nominal average particle diameter 30 nm, manufactured by C.I. Kasei Co., Ltd.), 1 g of polyethylene glycol (average molecular weight 600, manufactured by Wako Pure Chemical Industries, Ltd.) and 4 g of ethylene glycol (manufactured by Wako Pure Chemical Industries, Ltd.) was subjected to the same dispersion conditions as those of Example 1 to give a cupric oxide fine particles dispersion. The obtained cupric oxide dispersion was applied onto a slide glass so as to have a 5 cm length, 1 cm width, and 10 μm thickness. This slide glass was put into a baking furnace, and after the furnace interior had been vented by a vacuum pump, hydrogen gas was flowed in a flow rate of 1 liter/minute. The temperature of the baking furnace was raised over 1 hour from room temperature to 250° C. Once 250° C. had been reached, heating was continued for another one hour for baking. After cooling, a homogenous copper thin film having a thickness of 8 μm was confirmed to have formed on the slide glass. This thin film had high adhesiveness to the slide glass, wherein under the stripping test using scotch tape, the film was not stripped off. The volume resistivity of this film was a low $1.5\times10^{-5}$ Ωcm.

Examples 5 to 7

Preparation of Cupric Oxide Fine Particles Dispersion, Production Example of a Copper Thin Film A mixture of 5 g of cupric oxide nanoparticles (particle diameter 10 to 100 nm, nominal average particle diameter 30 nm, manufactured by C.I. Kasei Co., Ltd.), 4.5 g of ethylene glycol (manufactured by Wako Pure Chemical Industries, Ltd.) and 0.5 g of respectively 400, 600 and 1000 average molecular weight polyethylene glycol (manufactured by Wako Pure Chemical Industries, Ltd.) was subjected to the same dispersion conditions as those of Example 1 to give a cupric oxide fine particles dispersion. Copper thin films were obtained using the same procedure as that of Example 4. The obtained copper thin films all had high adhesiveness to the slide glass, wherein under the stripping test using scotch tape, none of the films was stripped off. The volume resistivity of these thin films was a low 2 to $3\times10^{-5}$ Ωcm.

Example 8

Preparation of Cupric Oxide Fine Particles Dispersion, Production Example of a Copper Thin Film A mixture of 4 g of cupric oxide nanoparticles (particle diameter 10 to 100 nm, nominal average particle diameter 30 nm, manufactured by C.I. Kasei Co., Ltd.), 2 g of water and 2 g of polyethylene glycol (manufactured by Wako Pure Chemical Industries, Ltd.) having an average molecular weight of 400, was subjected to the same dispersion conditions as those of Example 1 to give a cupric oxide fine particles dispersion. A copper thin film was obtained using the same procedure as that of Example 4. The obtained copper thin film was easily stripped off from the slide glass using scotch tape, and the volume resistivity was $4 \times 10^{-5}$ Ωcm.

Example 9

Preparation of Cuprous Oxide Fine Particles Dispersion, Production Example of a Copper Thin Film In a three necked flask made of glass, 2.7 g of copper acetate (manufactured by Wako Pure Chemical Industries, Ltd.) and 0.9 g of purified water were added to 90 ml of diethylene glycol. The resulting mixture was heated to 190° in an oil bath, and the heating was continued for 2 hours at that temperature. The reaction was ended after two hours, and after cooling to room temperature a product was obtained by centrifugal sedimentation using a centrifugal separator manufactured by Hitachi Koki Co., Ltd., wherein the unreacted copper acetate remaining in the supernatant liquid was discarded. To the centrifugally separated sediment, 100 ml of diethylene glycol was added and ultrasonically dispersed and successively by centrifugal separating with a force of 20,000 G cuprous oxide particles larger than 100 nm were made to sediment. Cuprous oxide particles of 100 nm or less which remained in the supernatant liquid were then made to sediment again by centrifugal separating with a force of 35,000 G, whereby cuprous oxide particles of 100 nm or less were obtained as a sediment. A portion of the obtained particles was put onto a slide glass, and then after vacuum drying at 85° C., the surface morphology was observed using an electron microscope. The cuprous oxide primary particle diameter was 30 to 100 nm, wherein the average particle diameter thereof was 80 nm. The average secondary particle diameter observed using a laser scattering method was 120 nm.

To 0.3 g of cuprous oxide, 0.12 g of polyethylene glycol (average molecular weight of 400, manufactured by Wako Pure Chemical Industries, Ltd.) and 0.18 g of diethylene glycol were added, the resulting mixture was subjected to ultrasonic dispersion to give a cuprous oxide dispersion. The obtained cuprous oxide dispersion was applied onto a slide glass so as to have a 5 cm length, 1 cm width, and 30 μm thickness. This slide glass was put into a baking furnace, and after the interior of the furnace had been vented by a vacuum pump, hydrogen gas was flowed in a flow rate of 0.1 liter/minute. The temperature of the baking furnace was raised over 1 hour from room temperature to 300° C. Once 300° C. had been reached, heating was continued for another one hour for baking. After cooling, a homogenous copper thin film having a thickness of 8 μm was confirmed to have formed on the slide glass. The obtained copper thin film had high adhesiveness to the slide glass, wherein under the stripping test using scotch tape, the film was not stripped off. The volume resistivity of this thin film was a low $4 \times 10^{-6}$ Ωcm.

Example 10

Preparation of a Cuprous Oxide Fine Particles Dispersion, and Production Example of a Copper Thin Film (Mixed Dispersion Medium Example)

To 0.3 g of the cuprous oxide particles obtained in Example 9, 0.12 g of polyethylene glycol (average molecular weight of 400 manufactured by Wako Pure Chemical Industries, Ltd.), 0.05 g of ethylene glycol and 0.13 g of ethanol were added. The resulting mixture was subjected to ultrasonic dispersion to give a cuprous oxide dispersion. This was applied onto a slide glass in the same way as in Example 9, then baked to give a copper thin film having a thickness of 9 μm and a volume resistivity of $6 \times 10^{-6}$ Ωcm. The obtained copper thin film had high adhesiveness to the slide glass, wherein it was not stripped off in the stripping test using scotch tape.

Example 11

Preparation of a Cuprous Oxide Fine Particles Dispersion, and Production Example of a Copper Thin Film (Example Wherein 2-Stage Baking Was Carried Out in an Inert Atmosphere and a Reducing Atmosphere)

In the baking step of the cuprous oxide fine particles dispersion obtained in Example 9, rather than directing carrying out hydrogen reduction treatment at 300° C., first the slide glass was placed on a hotplate. While nitrogen gas was made to flow over the entire hotplate, the hotplate temperature was raised from room temperature to 250° C. and baked for 1 hour at 250° C. After cooling, the preliminarily baked slide glass was moved to a baking furnace. After the baking furnace had been sufficiently exhausted of gases by a vacuum pump, hydrogen gas was flowed into the furnace for reduction baking for 1 hour at 300° C. to obtain a copper thin film having a film thickness of 5 μm. The volume resistivity of the copper thin film was extremely low at $3 \times 10^{-6}$ Ωcm. The obtained copper thin film had high adhesiveness to the slide glass, wherein it was not stripped off in the stripping test using scotch tape.

Example 12

Preparation of a Cuprous Oxide Fine Particles Dispersion Comprising a Sugar Alcohol, and Production Example of a Copper Thin Film 0.1 g of the cuprous oxide particles obtained in Example 9 having a particle diameter of 100 nm or less, 0.1 g of polyethylene glycol (average molecular weight of 400, manufactured by Wako Pure Chemical Industries, Ltd.), and 0.1 g of sorbitol were added to 0.7 g of ethylene glycol. The resulting mixture was subjected to ultrasonic dispersion to give a cuprous oxide dispersion containing 10% by weight of cuprous oxide. The average secondary particle diameter of the cuprous oxide in the cuprous oxide dispersion immediately after dispersing was 120 nm. After subjecting to ultrasonic dispersion the dispersion was left overnight. There was no change in the average secondary particle diameter of the cuprous oxide in the dispersion.

When the obtained dispersion was screen printed onto a polyimide film with a screen having a 30 μm line/space feature (manufactured by Sonocom Co., Ltd.), excellent printability was displayed. The above side glass was put into a baking furnace, and after the furnace interior had been vented by a vacuum pump, hydrogen gas was flowed in a flow rate of 1 liter/minute. The temperature of the baking furnace was raised over 1 hour from room temperature to 250° C. Once 250° C. had been reached, heating was continued for another one hour for baking. After cooling, the polyimide film was removed. When the surface of the film was observed by an electron microscope, copper wiring was confirmed to have formed without any disconnections.

Example 13

Preparation of a Cuprous Oxide Fine Particles Dispersion Comprising a Sugar Alcohol, and Production Example of a Copper Thin Film A cuprous oxide dispersion was prepared in the same weight ratio and the same procedure as that of Example 12, except that erythritol was used as the sugar alcohol. The resulting cuprous oxide dispersion was subjected to ultrasonic dispersion and left overnight, but there was no change in the average secondary particle diameter of the cuprous oxide in the dispersion of 120 nm. When the same dispersion was screen printed in the same manner as Example 12 onto a polyimide film with a screen having a 30 µm line/space feature, excellent printability was displayed. Heating treatment was carried out in the same manner as Example 12, wherein after cooling, the polyimide film was removed. When the surface of the film was observed by a microscope, copper wiring was confirmed to have formed without any disconnections.

Example 14

Preparation of a Cupric Oxide Fine Particles Dispersion Containing Metal Particles, and Production Example of a Copper Thin Film A mixture of 5 g of cupric oxide fine particles (particle diameter 10 to 100 nm, nominal average particle diameter 30 nm, manufactured by C.I. Kasei Co., Ltd.), 4 g of ethylene glycol (manufactured by Wako Pure Chemical Industries, Ltd.), polyethylene glycol (average molecular weight 600) and 0.5 g of silver particles (average particle diameter 2.5 µm, manufactured by Sigma-Aldrich Co.) was dispersed in the same manner as in Example 1 to give a cupric oxide fine particle dispersion containing silver particles, which was baked in the same manner as in Example 1. The volume resistivity of the obtained silver-particle containing copper thin film was $7 \times 10^{-5}$ Ωcm. Compared with a copper thin film which did not contain silver particles, the obtained thin film had strong oxidation resistance. In addition, this thin film had strong adhesiveness to the slide glass and was not stripped off in the stripping test using scotch tape.

Example 15

Preparation of a Cupric Oxide Fine Particles Dispersion Containing Metal Particles, Production Example of a Copper Thin Film A mixture of 5 g of cupric oxide fine particles (particle diameter 10 to 100 nm, nominal average particle diameter 30 nm, manufactured by C.I. Kasei Co., Ltd.), 4.5 g of ethylene glycol (manufactured by Wako Pure Chemical Industries, Ltd.), 0.1 g of 1,4-butanediol diglycidyl ether and 0.4 g of polyethylene glycol (average molecular weight 600) was dispersed in the same manner as in Example 1. After dispersion, 0.03 g of a microcapsule curing agent (Novacure HX-3088; manufactured by Asahi Kasei Epoxy Co., Ltd.) was added as an epoxy curing agent, and mixed with a spatula. Then, the mixture was baked and the volume resistivity was measured in the same manner as in Example 1. The volume resistivity was $7 \times 10^{-5}$ Ωcm. Compared with dispersions that did not contain an epoxy resin, the adhesiveness between the obtained copper thin film and the slide glass was extremely high.

Example 16

Preparation of a Cupric Oxide Fine Particles Dispersion Containing a Polyimide Resin, and a Production Example of a Copper Thin Film To 100 g of N-methylpyrrolidone (NMP), 10.0 g of bis(4-aminophenyl)ethyl and 10.9 g of pyromellitic acid anhydryde were dissolved and stirred at room temperature for 1 hour to give a NMP solution of a polyamide acid. To 2 g of this polyamide acid solution, 5 g of cupric oxide fine particles (particle diameter 10 to 100 nm, nominal average particle diameter 30 nm, manufactured by C.I. Kasei Co., Ltd.) and 3 g of ethylene glycol (manufactured by Wako Pure Chemical Industries, Ltd.) were added and dispersed in the same manner as in Example 1. This dispersion was applied onto a polyimide film (a Kapton film manufactured by Dupont-Toray Co., Ltd., film thickness 50 µm), cut into a 3 cm×3 cm size, and reduction treatment was carried out in a hydrogen atmosphere at 350° C. for 1 hour to form a polyimide-containing cupric thin film on the polyimide film. This copper thin film had conductivity, and its volume resistivity was $9 \times 10^{-5}$ Ωcm. Compared with a thin film formed on a polyimide film without using polyamide acid, its adhesion was extremely high.

Example 17

Preparation of a Cupric Oxide Fine Particles Dispersion Containing a Reducing Agent, and Production Example of a Porous Copper Thin Film There were added to 0.5 g of propionaldehyde (manufactured by Wako Pure Chemical Industries, Ltd.), 5 g of cupric oxide nanoparticles (particle diameter 10 to 100 nm, nominal average particle diameter 30 nm, manufactured by C.I. Kasei Co., Ltd.) and 4.5 g of diethylene glycol (manufactured by Wako Pure Chemical Industries, Ltd.) and dispersed in the same manner as in Example 1 to give a cupric oxide fine particles dispersion. This dispersion was applied onto a slide glass in the same manner as in Example 4. While argon gas was flowed in a flow rate of 0.1 liter/minute into the baking furnace, the temperature was raised over 1 hour from room temperature to 350° C. Once 350° C. had been reached, heating was continued for another one hour. The volume resistivity of the obtained copper thin film was $3 \times 10^{-5}$ Ωcm.

Example 18

Production Example of a Copper Thin Film on a Silicon Wafer

There were added 0.5 g of polyethylene glycol (manufactured by Wako Pure Chemical Industries, Ltd.), 5 g of cupric oxide nanoparticles (particle diameter 10 to 100 nm, nominal average particle diameter 30 nm, manufactured by C.I. Kasei Co., Ltd.) and 4.5 g of ethylene glycol (manufactured by Wako Pure Chemical Industries, Ltd.) and dispersed in the same manner as in Example 1 to give a cupric oxide fine particles dispersion. A 5 inch silicon wafer which had had surface treatment carried out beforehand by a surface treating agent (LS-3150) manufactured by Shin-Etsu Chemical Co., Ltd., was set onto a spin coater (1H-D7) manufactured by Mikasa Co., Ltd. The above dispersion was dripped onto the silicon wafer, and after being pre-spun at 1000 rpm×10 seconds, spin coating was performed under the conditions of 3000 rpm×30 seconds. The coated silicon wafer was baked in the same manner as in Example 1. The copper thin film obtained on the silicon wafer had a film thickness of 0.6 μm and a low volume resistivity of $6 \times 10^{-6}$ Ωcm.

Example 19

Preparation of a Cuprous Oxide Dispersion, and a Production Example of a Copper Thin Film To 60 ml of purified water, 8 g of copper acetate anhydride (manufactured by Wako Pure Chemical Industries, Ltd.) was added, and then hydrazine monohydrate (manufactured by Wako Pure Chemical Industries, Ltd.) was added thereto while stirring at 25° C. to cause a reduction reaction, which gave cuprous oxide fine particles having a primary particle diameter of 10 to 30 nm. To 0.5 g of the cuprous oxide fine particles, 0.1 g of diethylene glycol and 0.4 g of polyethylene glycol (average molecular weight of 200, manufactured by Wako Pure Chemical Industries, Ltd.) were added, and the resulting mixture was subjected to ultrasonic dispersion to prepare a cuprous oxide dispersion. The dispersion was applied onto a slide glass so as to have a 5 cm length, 1 cm width, and 20 μm thickness. This slide glass was put into a baking furnace, and after the interior of the furnace had been vented by a vacuum pump, it was replaced with argon gas. The temperature of the baking furnace was raised over 1 hour from room temperature to 350° C. Once 350° C. had been reached, heating was continued for another one hour for baking. After cooling, a copper thin film having a thickness of 7 μm and a volume resistivity of $4.0 \times 10^{-6}$ Ωcm was obtained. The obtained thin film had high adhesiveness to the slide glass, wherein using scotch tape the film was not stripped off.

Comparative Example 1

Particle Diameter of Metal Oxide Fine Particles

A cupric oxide dispersion was prepared by subjecting a mixture of 5 g of a cupric oxide powder (manufactured by Wako Pure Chemical Industries, Ltd.) having an average particle diameter of 2.8 μm and 5 g of diethylene glycol to the same dispersion treatment as that in Example 1, and the dispersion applied film was baked on a slide glass in the same manner as in Example 1. A large number of fine cracks was formed on the metal copper surface obtained on the slide glass, making it imperfect as a copper thin film. When observed by an SEM, the fusion of the particles among the copper powder was insufficient.

Comparative Example 2

Particle Diameter of Metal Oxide Fine Particles

A cupric oxide dispersion was prepared by subjecting a mixture of 5 g of a cupric oxide powder (manufactured by Wako Pure Chemical Industries, Ltd.) having an average particle diameter of 2.8 μm, 4.5 g of diethylene glycol and 0.5 g of polyethylene glycol (average molecular weight 600) to the same dispersion treatment as in Example 1, and the dispersion applied film was baked on a slide glass in the same manner as in Example 1. A large number of fine cracks was formed on the metal copper surface obtained on the slide glass, making it imperfect as a copper thin film. When observed by an SEM the fusion of the particles among the copper powder was insufficient.

INDUSTRIAL APPLICABILITY

According to the present invention, a metal thin film can be formed onto a substrate by a treatment at a relatively low temperature using a low cost metal oxide as the a raw material. By controlling the applied thickness onto the substrate of the metal oxide dispersion, a metal thin film thickness can be controlled arbitrarily. In addition, direct imaging formation of wiring by an inkjet application method is also possible, and therefore the method allows for wiring formation at low cost and with less resource because photolithography and etching steps of metal thin film, which were necessary in conventional wiring formation processes, can be omitted. The obtained metal thin film can be preferably used in applications such as a metal wiring material for electrodes, wiring and circuits, or as a conductive material. Further, the obtained porous metal thin film having a homogenous and fine porous structure with a pore diameter of 1 μm or less can be preferably used in applications such as, for example, a carrier for a catalyst, inorganic filters, conductive material, thermally conductive materials and the like, and also can be preferably used in applications such as electrodes which require a large surface area.

The invention claimed is:

1. A method of producing a thin conductive metal film, the method comprising:
applying a metal oxide dispersion onto a substrate, wherein said metal oxide dispersion comprises a metal oxide having a particle diameter of less than 200 nm and a dispersion medium, wherein the metal oxide dispersion medium comprises a polyhydric alcohol having 10 or less carbon atoms and a polyether compound which is an aliphatic polyether having repeating units of straight chain or a cyclic oxyalkylene group having 2 to 8 carbon atoms, wherein the polyether compound has a molecular weight of 150 to 6000, and the metal oxide is copper oxide or silver oxide; and
heat treating said metal oxide dispersion in a non-oxidizing or inert atmosphere to burn off said polyhydric alcohol and polyether, thereby forming said thin metal film.

2. The method of producing a thin conductive metal film according to claim 1, wherein said heat treatment temperature is 50° C. to 500° C.

3. The method of producing a thin conductive metal film according to claim 1, wherein the film has a volume resistivity of $9 \times 10^{-5}$ Ωcm or less.

4. The method of producing a thin conductive metal film according to claim 1, wherein the film has a volume resistivity of between $3 \times 10^{-6}$ Ωcm to $9 \times 10^{-5}$ Ωcm.

5. The method of producing a thin conductive metal film according to claim 1, wherein the metal oxide is present in a concentration of 10% by weight or more to 80% by weight or less based on an overall weight of the metal oxide dispersion.

6. The method of producing a thin conductive metal film according to claim 1, wherein the polyether compound has a molecular weight of 150 to 1500.

7. The method of producing a thin conductive metal film according to claim 1, wherein the polyether compound is a polyethylene glycol and/or polypropylene glycol having a molecular weight of 250 to 1500.

8. The method of producing a thin conductive metal film according to claim 1, wherein the polyhydric alcohol is a sugar alcohol.

9. The method of producing a thin conductive metal film according to claim 1, wherein a metal obtained by reducing the metal oxide has a volume resistivity of $1\times10^{-4}$ Ωcm or less.

10. The method of producing a thin conductive metal film according to claim 1, wherein the metal oxide is present in a concentration of 5 to 90 wt % based on an overall weight of the metal oxide dispersion.

11. The method of producing a thin conductive metal film according to claim 1, wherein the metal oxide dispersion further comprises a metal powder wherein the total weight of the metal powder and metal oxide fine particles ranges from 5 wt % to 95 wt % based on an overall weight of the metal oxide dispersion.

12. The method of producing a thin conductive metal film according to claim 11, wherein the metal powder includes at least one metal species selected from the group consisting of gold, silver, copper, palladium, platinum, nickel, chromium, aluminum, tin, zinc, titanium, tungsten, tantalum, barium, rhodium, ruthenium, osmium, bismuth, iridium, cobalt, indium, iron and lead.

13. The method of producing a thin conductive metal film according to claim 1, wherein the metal oxide dispersion further comprises a thermosetting resin present in a concentration of 0.1 wt % to 20 wt % based on an overall weight of the metal oxide dispersion.

14. The method of producing a thin conductive metal film according to claim 1, wherein the metal oxide dispersion further comprises a reducing agent, which can reduce the metal oxide and is other than a polyhydric alcohol and a polyether compound, wherein said reducing agent is present in a concentration of 0.1 wt % to 70 wt % based on an overall weight of the metal oxide dispersion.

15. The method of producing a thin conductive metal film according to claim 1, wherein the polyhydric alcohol is present in a concentration of 0.1 wt % to 95 wt % based on an overall weight of the metal oxide dispersion.

16. The method of producing a thin conductive metal film according to claim 1, wherein the polyether compound is present in a concentration of 0.1 wt % to 70 wt % based on an overall weight of the metal oxide dispersion.

17. The method of producing a thin conductive metal film according to claim 1, wherein the polyether compound is present in a concentration of less than 0.1 wt % based on an overall weight of the metal oxide dispersion.

* * * * *